United States Patent
Xu et al.

(10) Patent No.: US 6,633,215 B2
(45) Date of Patent: Oct. 14, 2003

(54) SUPERCONDUCTING MAGNETIC RESONANCE IMAGING MAGNET ASSEMBLY AND METHOD WITH REVERSE WIRE CHANNEL ORIENTATION

(75) Inventors: Minfeng Xu, Florence, SC (US); Michael Robert Eggleston, Florence, SC (US); Stephen R. Elgin, II, Florence, SC (US); Jinhua Huang, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 275 days.

(21) Appl. No.: 09/681,568

(22) Filed: May 1, 2001

(65) Prior Publication Data

US 2002/0163412 A1 Nov. 7, 2002

(51) Int. Cl.$^7$ .............................. H01F 7/20; G01V 3/00; H01B 13/00
(52) U.S. Cl. .................... 335/216; 324/319; 29/599; 174/125.1
(58) Field of Search ................... 335/216, 299; 324/318, 319, 320; 174/125.1; 29/599

(56) References Cited

U.S. PATENT DOCUMENTS

| | | | | |
|---|---|---|---|---|
| 4,377,905 A | * | 3/1983 | Agatsuma et al. | 29/599 |
| 4,994,633 A | * | 2/1991 | Puhn | 174/125.1 |
| 5,359,310 A | | 10/1994 | Pissanetzky | 335/301 |
| 5,382,904 A | | 1/1995 | Pissanetzky | 324/319 |
| 5,389,909 A | | 2/1995 | Havens | 335/216 |
| 5,428,292 A | | 6/1995 | Dorri et al. | 324/319 |
| 5,677,630 A | | 10/1997 | Laskaris et al. | 324/320 |
| 5,818,319 A | * | 10/1998 | Crozier et al. | 335/299 |
| 6,064,290 A | | 5/2000 | Xu et al. | 335/296 |

* cited by examiner

Primary Examiner—Ramon M. Barrera
(74) Attorney, Agent, or Firm—Collard & Roe, P.C.

(57) ABSTRACT

A superconducting magnetic resonance imaging magnet assembly is provided. The assembly includes an axial imaging bore to receive patients and a coil housing surrounding the axial bore. A main magnet coil assembly is disposed within the housing. The main magnet coil assembly includes a plurality of main magnet coils to produce a magnetic field. At least three pairs of superconductive coils are provided. In one aspect, each of the coils in at least one of the pairs comprises a superconductor wire carrying an electric current in a direction opposite to the direction of current carried by the coils of another of the superconductive pairs. The superconductor wire comprises a superconductor core and a stabilizer having a channel. The wire is wound so that the channel has a radially outward facing opening. In another embodiment, low-aspect-ratio coils are used for at least one of the pairs of superconductive coils with the outer diameter coil portion comprising a superconductor core and a stabilizer channel having a radially outward facing opening.

22 Claims, 3 Drawing Sheets

SUPERCONDUCTING MAGNETIC RESONANCE IMAGING MAGNET ASSEMBLY AND METHOD WITH REVERSE WIRE CHANNEL ORIENTATION

BACKGROUND OF INVENTION

1. Field of the Invention

The present invention relates to a superconducting magnet assembly for a magnetic resonance imaging system (hereinafter called "MRI"). More particularly, the invention relates to an arrangement for improving the stability of the superconducting MRI magnets in the assembly. A method of making a superconducting magnet assembly is also provided.

2. The Prior Art

Many superconducting MRI magnets are wound with superconductor wires consisting of a superconductor core and a copper or aluminum stabilizer. When a superconducting magnet is energized at low temperatures, the electric current will flow through the wire's superconductor core. The electric current results in an electromagnetic force that applies to the superconductor core. The force is reacted against the copper or aluminum stabilizer that is supported by the coil supporting structure.

Certain superconductor wires are made so that the superconductor core is soldered into a copper stabilizer channel. A circular coil is commonly wound with this type of wire so that the channel opening faces radially inward. With this orientation, the core is in the inner diameter and the channel covers the core on the outer diameter. This orientation transfers the radial electromagnetic force acting on the core to the channel through the bottom of the channel.

However, a problem arises when the radial electromagnetic force reverses. In certain types of magnet coil designs with multilayer wires, a very low coil aspect ratio is required. A low-aspect-ratio coil in a magnetic resonance magnet is a coil whose radial dimension is greater than or approximately the same as the axial dimension of the coil. In these designs, wires on the outer portion of the coil near the outer diameter could experience large radially inward force. In some other magnet designs, some of the coils have reverse current with respect to the main coil current. These coils are wound on the same main coil structure and may experience a huge net radially inward force. In these cases, the direction of force on the core tends to push the core out of the channel. As a result, the superconductor core separates from the stabilizer.

SUMMARY OF INVENTION

In response to the above problems, a superconducting magnetic resonance imaging magnet assembly is provided. In one aspect, the wire orientation is reversed for the outer diameter portion of the low-aspect-ratio coils in the main magnet coil assembly. In another aspect, the wire orientation is reversed for the reverse current coils on the main magnet coil assembly. These reverse current coils have very large radially inward force. The assembly comprises an axial imaging bore to receive patients and a coil housing surrounding the axial bore. A main magnet coil assembly is disposed within the housing. The main magnet coil assembly includes a plurality of main magnet coils, for example six, eight or ten coils, which are preferably circular, to produce a magnetic field. At least three pairs of superconductive coils are included in the main magnet coil assembly.

In one embodiment, each of the coils in at least one of the pairs of superconductive coils comprises a superconductor wire carrying an electric current in a direction opposite to the direction of current carried by the coils of another of the superconductive coil pairs. The superconductive wire includes a superconductor core and a stabilizer. The stabilizer comprises a channel having a radially outward facing opening.

In another embodiment, low-aspect-ratio coils are used for at least one of the pairs of superconductive coils. Each low-aspect-ratio coil comprises an inner diameter coil portion joined to an outer diameter coil portion. The inner diameter coil portion comprises a superconductor core and a stabilizer channel having a radially inward facing opening. The outer diameter coil portion comprises a superconductor core and a stabilizer channel having a radially outward facing opening. The two coil portions may be connected together with a superconducting joint or a resistive joint.

The stabilizer may be formed from copper or aluminum and the superconductor core soldered into the stabilizer channel.

In a further embodiment, a bucking coil assembly including at least two bucking coils, is disposed within the coil housing.

A method of making a superconducting magnetic resonance imaging magnet is also provided. In one aspect, a first main magnet coil is formed carrying electric current in a first direction. A second main magnet coil is formed carrying electric current in a second direction opposite to the first direction. Each second main magnet coil comprises a superconducting wire comprising a superconductor core and a stabilizer. The stabilizer comprises a channel having a radially outward facing opening.

In another aspect, a second main magnet coil having a low coil aspect ratio is formed. The inner diameter portion of the second main magnet coil is formed by winding a superconductor wire having a superconductor core and a stabilizer channel having a radially inward facing opening. The outer diameter portion of the coil is then formed by winding a superconductor wire having a superconductor core and a stabilizer channel having a radially outward facing opening.

BRIEF DESCRIPTION OF DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawings, wherein similar reference characters denote similar elements throughout the several views.

DETAILED DESCRIPTION

Figure 1:
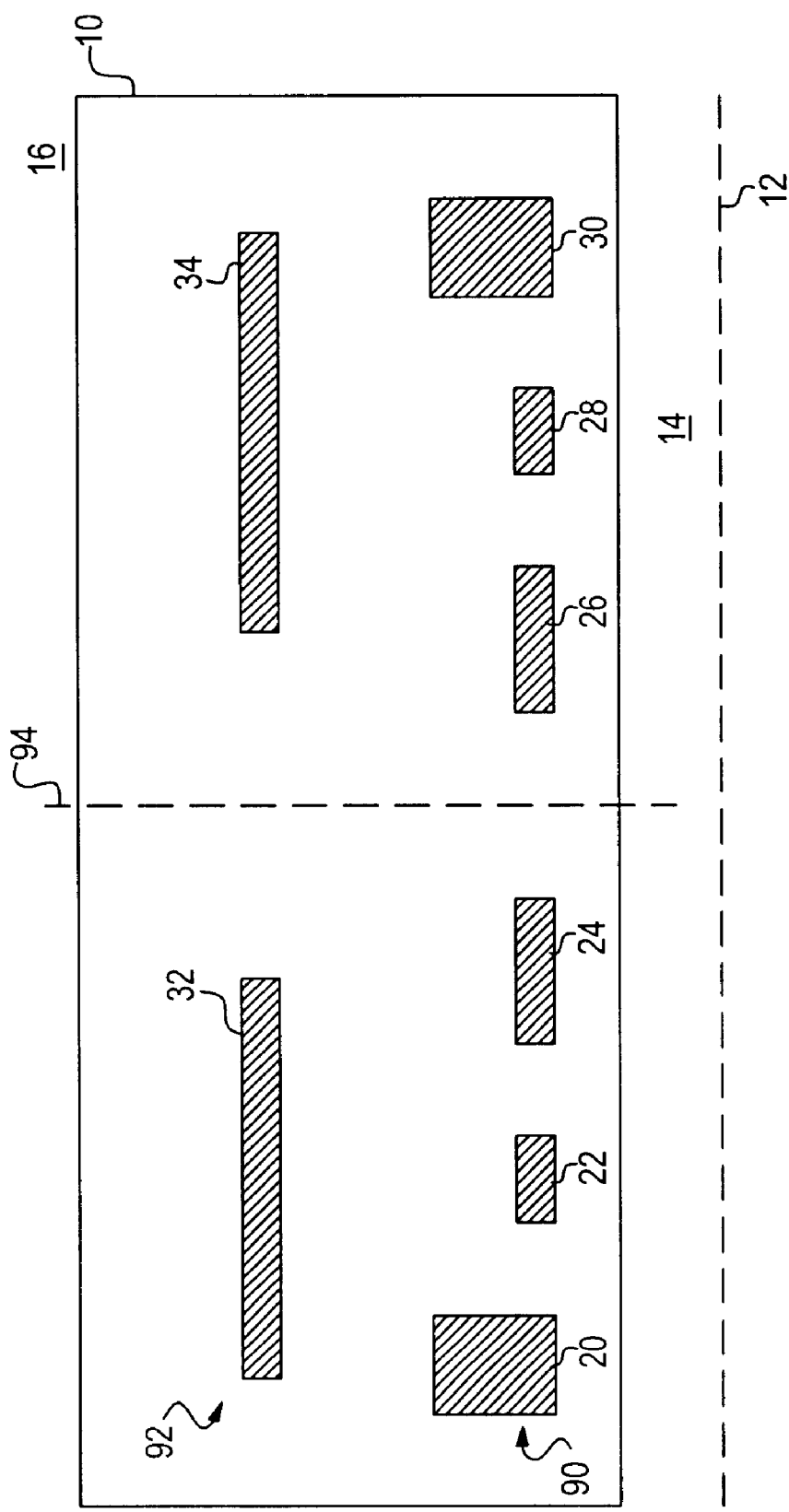
FIG. 1 is a simplified cross-sectional schematic diagram of a superconducting magnetic assembly.

Referring first to FIG. 1, a superconducting magnet assembly 16 with an imaging bore 14 and a coil housing 10 is shown. Coil housing 10 is typically toroidal in shape with a generally longitudinal magnet axis 12. Coil housing includes a cryogen or helium vessel which extends along and around axis 12. Superconducting magnet assembly 16 also includes a main magnet coil assembly 90 disposed within coil housing 10. Main coil assembly 90 includes a plurality of main magnet coils. Preferably six, eight or ten coils are arranged in pairs symmetrically around midplane 94 of main magnet assembly 16.

As shown in FIG. 1, there are at least three pairs of superconductive coils. Coils 20 and 30 are low-aspect-ratio coils. Coils 22 and 28 are reverse current coils carrying current in a direction opposite to the direction of current carried by coils 24 and 26. Main magnet coils 20, 22, 24, 26, 28 and 30 are positioned within a helium vessel forming coil housing 10. The coils are contiguous to and surround imaging bore 14, and axially spaced along axis 12. The main magnet coils are supported by a supporting structure such as an annular cylindrical aluminum drum or cylindrical coil forms attached to the housing 10. Such supporting structures are conventional and are not shown. A bucking coil assembly 92 including one or more bucking or shielding coils such as those shown by 32 and 34 are included within the helium vessel of coil housing 10 to reduce the magnetic stray field and minimize siting and installation costs. Preferably, bucking or shielding coils 32 and 34 concentrically surround portions of main magnet coils 20, 22, 24, 26, 28 and 30. Solenoidal main magnet coils 20, 22, 24, 26, 28 and 30 produce a highly uniform magnetic field of a large magnitude. One or more shim drawers (not shown) utilizing ferromagnetic members in accordance with U.S. Pat. No. 5,389,909 to Havens may also be provided to enable adjustment and improvement of the magnetic field homogeneity within imaging bore 14.

Main magnet coil assembly 90 includes a generally annular-shaped superconductive first main coil pair 24, 26 carrying an electric current in a first direction. The first direction may be either a clockwise or a counterclockwise circumferential direction about axis 12 with any slight longitudinal component of current direction being ignored. Preferably, main coil assembly 90 also includes a second main coil pair 22, 28 adjacently radially spaced from the first main coil pairs 24, 26. The spaced main coil pairs 22, 28 carry an electric current in a direction opposite to the direction of current carried by coils 24, 26. A reverse current coil in the main coil assembly is introduced to improve the homogeneity of the magnet in certain designs. For example, U.S. Pat. No. 5,382,904 to Pissanetzsky and U.S. Pat. No. 5,677,630 to Laskaris et al. show magnet designs using reverse current coils. See also U.S. Pat. No. 5,428,292 to Dorri et al.

Figure 2:
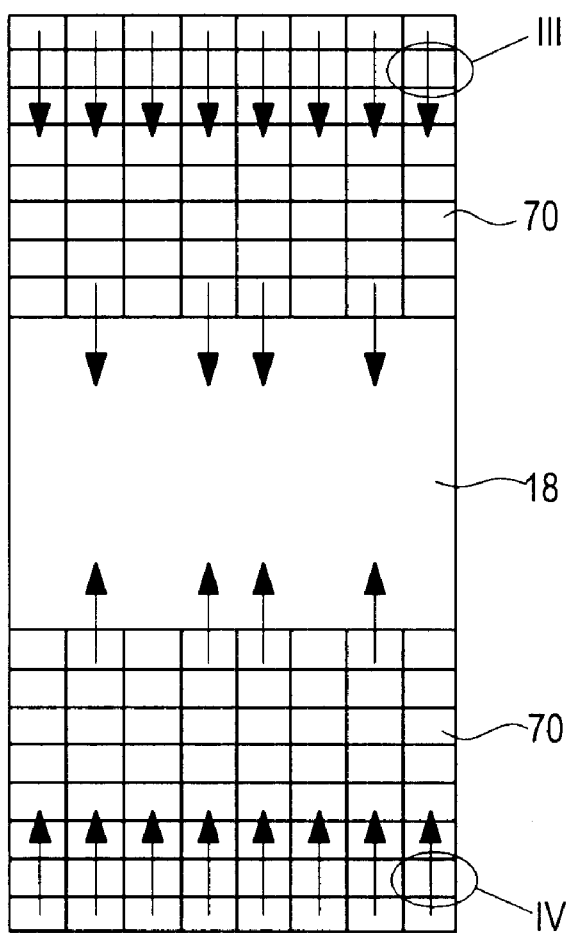
FIG. 2 is a cross-sectional view of a coil with reverse current in the main coil assembly.
Figure 3:
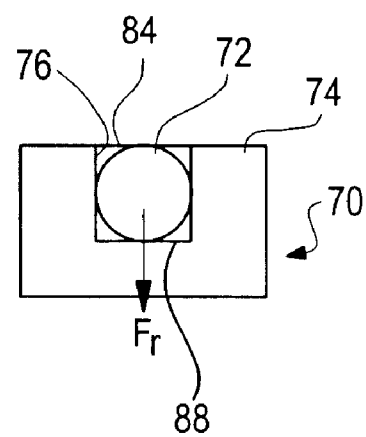
FIG. 3 is an enlarged view of area III of FIG. 2.
Figure 4:
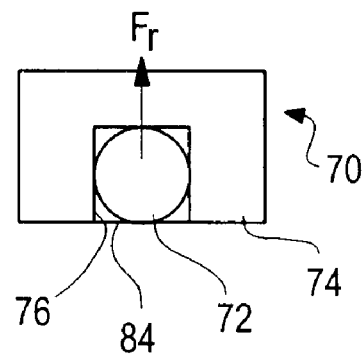
FIG. 4 is an enlarged view of area IV of FIG. 2.

The main coils are preferably wound sequentially with superconductor wire from one end of a supporting structure, such as a coil form, to the other with the coils connected in series. As shown in FIG. 2, wire 70 of a reverse current coil is wound radially concentric with and contiguous to main magnet coil 20 wound on a main coil assembly form 18. The reverse current coil is designed to have a reverse current with respect to the current in at least one of the coils in main magnet coil assembly 90. As shown in FIGS. 3 and 4, the superconductor wire 70 preferably consists of a superconductor core 72 and a copper or aluminum stabilizer 74. For example, the superconductor core 72 is soldered into a copper stabilizer channel 76 with solder/filler 88 filling the remainder of channel 76.

The wire orientation shown in FIGS. 3 and 4 is in contrast to the common practice of winding the wire such that the channel opening is facing radially inwardly. Instead, wire 70 is wound so that wire channel opening 84 faces radially outward in winding so that core 72 is in the outer diameter and channel 76 covers core 72 on the inner diameter. In this way, the bottom of channel 76 supports the large electromagnetic radially inward force $F_r$ acting on wire 70 to prevent core 72 from separating from channel 76.

Figure 5:
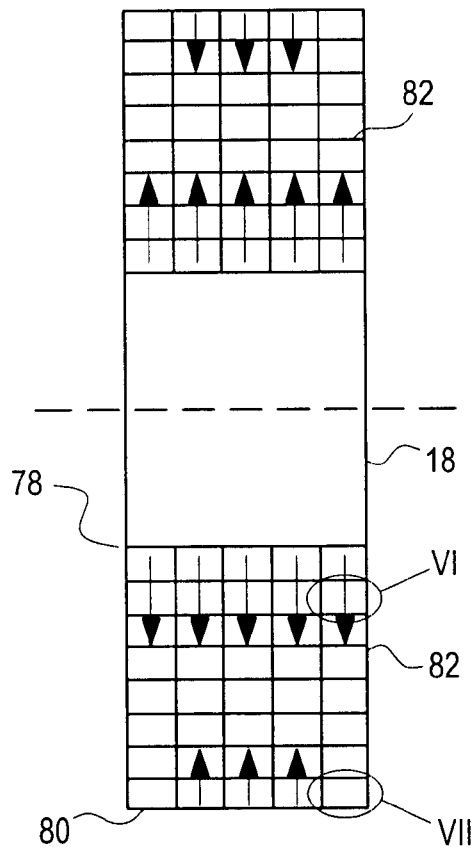
FIG. 5 is a cross-sectional view of a superconducting coil with a low aspect ratio in which the outer diameter coil portion is wound with reverse orientation with the channel facing radially outward.
Figure 6:
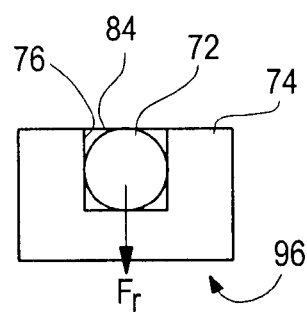
FIG. 6 is an enlarged view of area VI of FIG. 5 showing wire orientation at the inner diameter of the coil.
Figure 7:
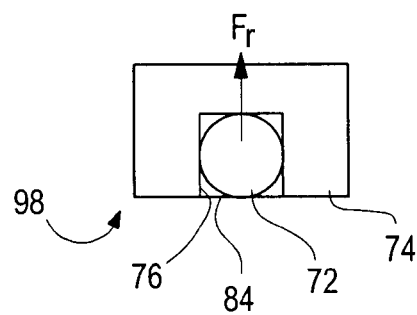
FIG. 7 is an enlarged view of area VII of FIG. 5 showing wire orientation at the outer diameter of the coil.

FIG. 5 shows magnet winding support form 18 with a multi-layer superconductor wire in place. In this magnet design, each of the coils of at least one of the pairs of main magnet coil assembly 90, for example coils 20, 30, has a low coil aspect ratio. In other words, the radial dimension of the coil is greater than or approximately the same as the axial dimension of the coil. As shown in FIG. 6, a first superconductive wire 96 is wound in a conventional way to form the inner diameter portion 78 of the coil with opening 84 of channel 76 facing inward. As shown in FIG. 7, the outer diameter coil portion 80 is formed by winding a second superconductive wire 98 with reverse orientation with opening 84 of channel 76 facing radially outward. The two coil portions 78 and 80 are connected together, for example with a superconducting or resistive joint 82.

While preferred embodiments of the present invention have been shown and described, it is to be understood that many changes and modifications may be made thereunto without departing from the spirit and scope of the invention as defined in the appended claims.

What is claimed is:

1. A superconducting magnetic resonance imaging magnet assembly comprising:
    (a) an axial imaging bore to receive patients;
    (b) a coil housing surrounding said axial bore;
    (c) a main magnet coil assembly disposed within said housing, said main magnet coil assembly including a plurality of main magnet coils to produce a magnetic field comprising at least three pairs of superconductive coils;
    each of the coils in at least one of said pairs comprising a superconductor wire carrying an electric current in a direction opposite to the direction of current carried by the coils of another of said superconductive coil pairs, said superconductive wire comprising a superconductor core and a stabilizer comprising a channel having a radially outward facing opening;
    wherein at least one of the pairs of superconductive coils comprises a pair of low-aspect-ratio coils, each of said low-aspect-ratio coils comprising an inner diameter coil portion joined to an outer diameter coil position, said inner diameter coil portion comprising a superconductor wire comprising a superconductor core and a stabilizer channel having a radially inward facing opening, said outer diameter coil portion comprising a superconductor wire comprising a superconductor core and a stabilizer channel having a radially outward facing opening.

2. A superconducting magnetic resonance imaging assembly according to claim 1 wherein the stabilizer is formed from copper or aluminum.

3. A superconducting magnetic resonance imaging assembly according to claim 1 wherein the stabilizer channel is formed from copper and the superconductor core is soldered into the copper stabilizer channel.

4. A superconducting magnetic resource imaging assembly according to claim 1 wherein the main magnet coils are circular.

5. A superconducting magnetic resonance imaging magnet assembly according to claim 1, wherein the inner diameter coil portion and the outer diameter coil portion are joined with a superconducting joint or a resistive joint.

6. A superconducting magnetic resonance imaging magnet assembly comprising:
   (a) an axial imaging bore to receive patients;
   (b) a coil housing surrounding said axial bore;
   (c) a main magnet coil assembly disposed within said housing, said main magnet coil assembly including a plurality of main magnet coils to produce a magnetic field comprising at least three pairs of superconductive coils, at least one of the pairs of superconducting coils comprising a pair of low-coil-aspect-ratio coils;
   each of said low-aspect-ratio coils comprising an inner diameter coil portion joined to an outer diameter coil portion, said inner diameter coil portion comprising a superconductor wire comprising a superconductor core and a stabilizer channel having a radially inward facing opening, said outer diameter coil portion comprising a superconductor wire comprising a superconductor core and a stabilizer channel having a radially outward facing opening.

7. A superconducting magnetic resonance imaging assembly according to claim 6 wherein the stabilizer channel is formed from copper or aluminum.

8. A superconducting magnetic resonance imaging assembly according to claim 6 wherein the stabilizer channel is formed from copper and the superconductor core is soldered in the copper stabilizer channel.

9. A superconducting magnetic resonance imaging assembly according to claim 6 wherein the main magnet coils are circular.

10. A superconducting magnetic resonance imaging magnet assembly according to claim 6 wherein the inner diameter coil portion and the outer diameter coil portion are joined with a superconducting joint or resistive joint.

11. A method of making a superconducting magnetic resonance imaging magnet including an axial bore to receive patients and a coil housing surrounding said axial bore, which comprises the steps of:
   (a) forming a first main magnet coil carrying electric current in a first direction;
   (b) forming a second main magnet coil carrying electric current in a second direction opposite to the first direction, said second main magnet coil comprising a superconductor wire comprising a superconductor core and a stabilizer comprising a channel having a radially outward facing opening; and
   (c) forming a third main magnet coil comprising a low-aspect-ratio coil comprising an inner diameter coil portion joined to an outer diameter coil portion, said inner diameter coil, portion comprising a superconductor wire comprising a superconductor core and a stabilizer channel having a radially inward facing opening, said outer diameter coil portion comprising superconductor wire comprising a superconductor core and a rising a superconductor core and a stabilizer channel having a radially outward facing opening.

12. A method according to claim 11 wherein the stabilizer is formed from copper or aluminum.

13. A method according to claim 11 wherein the stabilizer channel is formed from copper and the superconductor core is soldered into the copper stabilizer channel.

14. A method according to claim 11 wherein the inner diameter coil portion and the outer diameter coil portion are joined with a superconducting joint or a resistive joint.

15. A method of making a superconducting magnetic resonance imaging magnet including an axial bore to receive patients and a coil housing surrounding said axial bore, and a plurality of coil supports positioned about, and spaced along, said axial bore, which comprises the steps of:
   (a) forming a first main magnet coil;
   (b) forming a second main magnet coil having a low coil aspect ratio by
      (i) winding a superconductor wire comprising a superconductor core and a stabilizer channel having a radially inward facing opening to form an inner diameter coil portion;
      (ii) winding a superconductor wire comprising a superconductor core and a stabilizer channel having a radially outward facing opening to form an outer diameter coil portion; and
      (iii) joining the inner diameter coil portion to the outer diameter coil portion.

16. A method according to claim 15 wherein the stabilizer channel is formed from copper or aluminum.

17. A method according to claim 15 wherein the stabilizer channel is formed from copper and the superconductor core is soldered into the copper stabilizer channel.

18. A method according to claim 15 wherein the inner diameter coil portion and the outer diameter coil portion are joined with a superconducting joint or a resistive joint.

19. A superconducting magnetic resonance imaging magnet assembly comprising:
   (a) an axial imaging bore to receive patients;
   (b) a coil housing surrounding said axial bore;
   (c) a main magnet coil assembly disposed within said housing, said main magnet coil assembly including at least six circular main magnet coils arranged in pairs of superconductive coils to produce a magnet field;
   each of the coils in at least one of said pairs comprising a superconductor wire carrying an electric current in a direction opposite to the direction of current carried by the coils of another of said superconductive coil pairs, said superconductor wire comprising a superconductor core soldered into a copper stabilizer channel having a radially outward facing opening; and
   (d) a bucking coil assembly including at least two bucking coils disposed within said housing;
   wherein at least one of the pairs of superconductive coils comprises a pair of low-aspect-ratio coils, each of said low-aspect-ratio coils comprising an inner diameter coil portion joined to an outer diameter coil portion with a superconducting joint or a resistive joint, said inner diameter coil portion comprising a superconductor wire comprising a superconductor core soldered into a copper stabilizer channel having a radially inward facing opening said outer diameter coil portion comprising a superconductor wire comprising a superconductor core soldered into a stabilizer channel having a radially outward facing opening.

20. A superconducting magnetic resonance imaging magnet assembly comprising:
   (a) an axial imaging bore to receive patients;
   (b) a coil housing surrounding said axial bore;
   (c) a main magnet coil assembly disposed within said housing, said main magnet coil assembly including at least three pairs of superconductive coils, at least one of the pairs of superconductive coils comprising a pair of multilayer low-aspect-ratio coils;

each of said low-aspect-ratio coils comprising an inner diameter coil portion joined to an outer diameter coil portion with a superconducting joint or a resistive joint, said inner diameter coil portion comprising a superconductor wire comprising a superconductor core soldered into a copper stabilizer channel having a radially inward facing opening, said outer diameter coil portion comprising a superconductor wire comprising a superconductor core soldered into a copper stabilizer channel having a radially outward facing opening; and (d) a bucking coil assembly including at least two bucking coils disposed within said housing.

21. A method of making a superconducting magnetic resonance imaging magnet including an axial bore to receive patients and a coil housing surrounding said axial bore, which comprises the steps of:

(a) forming a first pair of circular main magnet coils carrying electric current in a first direction;

(b) forming a second pair of main magnet coils carrying electric current in a second direction opposite to the first direction, each of the coils in said second pair comprising a superconductor wire comprising a superconductor core soldered into a copper stabilizer channel having a radially outward facing opening; and (c) forming a third pair of main magnet coils, wherein each coil of said third pair comprises a low-aspect-ratio coil comprising an inner diameter coil portion joined to an outer diameter coil portion with a superconducting joint or a resistive joint, said inner diameter coil portion comprising a superconductor wire comprising a superconductor core soldered into copper stabilizer channel having a radially inward facing opening, said outer diameter coil portion comprising a superconductor wire comprising a superconductor core soldered into a copper stabilizer channel having a radially outward facing opening.

22. A method of making a superconducting magnetic resonance imaging magnet including an axial bore to receive patients and a coil housing surrounding said axial bore, which comprises the steps of:

(a) forming a first pair of circular main magnet coils;

(b) forming a second pair of main magnet coils having a low coil aspect ratio by, for each coil of said second pair:

(i) winding a superconductor wire comprising a superconductor core soldered into a copper stabilizer channel having a radially inward facing opening to form an inner diameter coil portion;

(ii) winding a superconductor wire comprising a superconductor core soldered into a copper stabilizer channel having a radially outward facing opening to form an outer diameter coil portion; and (iii) joining the inner diameter coil portion to the outer diameter coil portion with a superconducting joint or a resistive joint.

* * * * *

UNITED STATES PATENT AND TRADEMARK OFFICE
CERTIFICATE OF CORRECTION

PATENT NO.    : 6,633,215 B2
DATED         : October 14, 2003
INVENTOR(S)   : Xu et al.

It is certified that error appears in the above-identified patent and that said Letters Patent is hereby corrected as shown below:

Column 5,
Line 60, before "superconductor wire" add -- a --.
Line 61, delete "and a rising a superconductor core."

Column 6,
Line 57, after "opening", add -- , --.

Signed and Sealed this

Thirtieth Day of December, 2003

JAMES E. ROGAN
*Director of the United States Patent and Trademark Office*